United States Patent [19]
Suwald

[11] Patent Number: 5,554,949
[45] Date of Patent: Sep. 10, 1996

[54] CIRCUIT ARRANGEMENT FOR DELAYING A FUNCTIONAL SIGNAL

[75] Inventor: Thomas Suwald, Hamburg, Germany

[73] Assignee: U.S. Philips Corporation, New York, N.Y.

[21] Appl. No.: 167,265

[22] Filed: Dec. 14, 1993

[30]     Foreign Application Priority Data

Dec. 15, 1992  [DE]  Germany ............................ 42 42 201.9

[51] Int. Cl.$^6$ ............................ H03H 11/26; H03K 1/04; H03K 17/28
[52] U.S. Cl. .................... 327/276; 327/279; 327/291; 327/293; 327/294; 327/400; 327/401
[58] Field of Search .................................. 307/602, 603, 307/605, 607, 595, 596, 597, 272.1, 279, 269; 328/55, 63, 72; 377/76, 77, 78, 79, 64; 327/276, 279, 291, 293, 294, 393, 395, 396, 400, 401, 403, 270, 273, 286

[56]          References Cited

U.S. PATENT DOCUMENTS

| 4,443,765 | 4/1984 | Findeisen et al. ...................... 307/602 |
| 5,016,263 | 5/1991 | Kitagawa et al. ......................... 377/76 |
| 5,287,025 | 2/1994 | Nishimichi ............................. 307/602 |

*Primary Examiner*—David C. Nelms
*Assistant Examiner*—Trong Phan
*Attorney, Agent, or Firm*—Laurie E. Gathman

[57]          ABSTRACT

A circuit arrangement for delaying a useful signal which is stored in the form of time-discrete signal samples in a row of storage devices at time intervals which are determined by a clock signal and is read therefrom after expiration of a selectable delay time. Each storage device is connectable, via a respective input circuit to a useful signal input and, via a respective output circuit, to a useful signal output. The the input circuit of a storage device being activatable, together with the output circuit of the next storage device in the row, by a respective activation device, which includes a shift register device formed by a chain of bistable trigger circuits in which the output of each of the trigger circuits is connected to the input of the next trigger circuit in the chain, each activation device including one of the trigger circuits and all trigger circuits being switched by the clock signal, and also comprising a command device which applies a (first) start pulse to the first trigger circuit in the shift register device at a first instant and which enables the shift register device to propagate the start pulse through the chain of trigger circuits in conformity with the clock signal and which interrupts the propagation of the (first) start pulse at a second instant and at the same time applies a next start pulse to the first trigger circuit in the shift register device and enables the shift register device again to propagate said next start pulse, the time interval between the first instance (t1) and the second instant (t10) amounting to a selectable, integer multiple of periods of the clock signal, the number (n) of storage devices or trigger circuits corresponding at least to said multiple (n) of the periods of the clock signal. This circuit arrangement can be simply adapted to a plurality of different desired delay time values, during operation.

9 Claims, 3 Drawing Sheets

CIRCUIT ARRANGEMENT FOR DELAYING A FUNCTIONAL SIGNAL

FIELD OF THE INVENTION

The invention relates to a circuit arrangement for delaying a functional signal.

BACKGROUND OF THE INVENTION

Various types of circuit arrangements for delaying functional signals are known. For example, delay lines which are formed on a glass substrate and realize a delay of an electrically presented signal by way of the propagation time of acoustic surface waves have since long been known. Other types utilize clocked shift registers for delaying binary useful signals. Also known are types of delay lines in which analog signals in the form of time-discrete signal samples are conducted through so-called bucket brigade circuits in which they are delayed. All delay circuits known thus far have the drawback that they have only one, fixed delay time which is imposed by the construction and which is very difficult or impossible to change during operation. For example, the delay time of a delay line formed by a bucket brigade circuit could be changed by changing the frequency of the clock signal driving the bucket brigade circuit. However, the sampling frequency of the signal samples passing through the bucket brigade circuit is thus also changed in a frequently non-usable manner.

It is an object of the invention to provide a circuit arrangement for delaying a functional signal which can in practice be readily adapted for a plurality of different values of the desired delay time, i.e. a circuit which is preferably switchable.

This object is achieved in accordance with the invention by means of a circuit arrangement for delaying a functional signal which is stored in the form of time-discrete signal samples in a row of storage devices at time intervals determined by a clock signal and is read therefrom after expiration of a selectable delay time, each storage device being connectable, via a respective input circuit, to a functional signal input and, via a respective output circuit, to a functional signal output for this purpose, the input circuit of a storage device being activatable together with the output circuit of the next storage device in the row by a respective activation device, comprising a shift register device formed by a chain of bistable trigger circuits in which the output of each of the trigger circuits is connected to the input of the next trigger circuit in the chain, each activation device comprising one of the trigger circuits and all trigger circuits being switched by the clock signal, and also comprising a command device which applies a (first) start pulse to the first trigger circuit in the shift register device at a first instant and which enables the shift register device to propagate the start pulse through the chain of trigger circuits in conformity with the clock signal and which interrupts the propagation of the (first) start pulse at a second instant and at the same time applies a next start pulse to the first trigger circuit in the shift register device and enables the shift register device again to propose said next start pulse, the time interval between the first instant and the second instant amounting to a selectable, integer multiple of periods of the clock signal the number of storage devices or trigger circuits corresponding at least to said multiple of the periods of the clock signal.

Thus, the circuit arrangement in accordance with the invention is preferably constructed so that a parallel connection of several storage devices for separate, time-discrete signal samples is arranged between the functional signal input for the signal to be deplayed and the functional signal output for the delayed signal. In the recurrency of the clock signal at which the time-discrete signal probes are acquired the storage devices are successively loaded with these signal probes and are read out again after expiration of the desired delay time. The number of storage devices should, therefore, be one greater than the (integer) quotient of the longest desired delay time and the period of the clock signal. In this circuit arrangement the clock signal may remain unchanged even when arbitrary delay times are chosen, so that it need merely be adapted to the requirements imposed in respect of bandwidth on the useful signal transmitted via time-discrete signal samples. A clock signal which is constant and remains unchanged in all signal processing stages can thus be used for complex signal processing with inter alia one or more signal delays.

The possibilities for use of the circuit arrangement in accordance with the invention are also greater than the delay devices having a strictly predetermined delay time. The more flexible circuit arrangement for delaying a functional signal can lead inter alia to simplified circuit concepts in signal processing.

In a preferred embodiment of the invention, the command device comprises a presettable counting device whose counting cycle can be adjusted to the selected multiple of the periods of the clock signal and which outputs one of the start pulses after each counting cycle. This counting device thus enables simple control of the delay time as a selectable multiple of the periods of the clock signal by control signals as used in many complex signal processing devices. This also simply enables program-controlled variations of the desired delay time.

Preferably, the trigger circuits comprise a respective D-flipflop clocked in common by the clock signal, so that the propagation of the start pulse through the shift register device can be controlled in a simple manner. In a further embodiment of the invention, this control is also provided by an AND-gate which precedes the input of each D-flipflop and in which the output signal of the preceding trigger circuit is combined with an enable signal from the command device. The propagation of the start pulses through the shift register device can thus be simply interrupted by a single control signal at any location of the shift register device, i.e. at any instant.

Further embodiments of the invention are recited in the further dependent claims.

BRIEF DESCRIPTION OF THE DRAWINGS

An embodiment of the invention will be described in detail hereinafter with reference to the drawing. Therein.

DETAILED DESCRIPTION OF PREFERRED EMBODIMENTS

Figure 1:
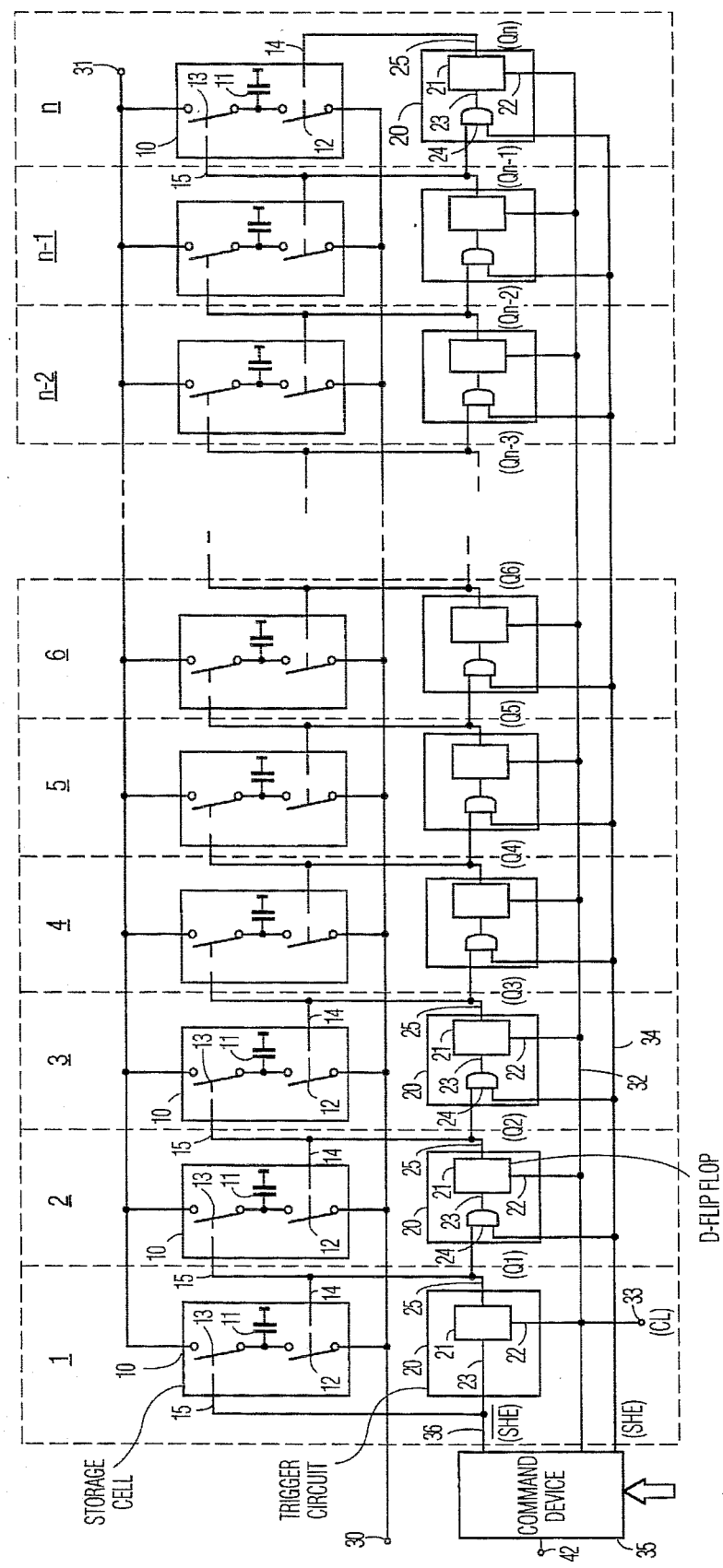
FIG. 1 shows a block diagram of a circuit arrangement for delaying a functional signal in accordance with the invention.

FIG. 1 shows an embodiment of the circuit arrangement for delaying a functional signal in accordance with the invention, comprising a row of storage cells 10 and a chain of bistable trigger circuits 20, each numbered from 1 to n. In FIG. 1 the sequence numbers 1 to n are enclosed by small circles in order to distinguish them from the other references. In the circuit arrangement shown in FIG. 1, each storage cell 10 is associated with a trigger circuit 20 bearing the same sequence number. For the sake of clarity of FIG. 1, however, the references are not inserted for each storage cell 10 and each bistable trigger circuit 20, because they are identically repeated for all storage cells 10 and all trigger circuits 20.

Each storage cell 10 shown in FIG. 1 comprises a storage device 11 for a signal sample. In the present embodiment the storage devices 11 are constructed as capacitors for analog signal samples. Via an input circuit 12, symbolically represented by a switch in the present case, the storage device 11 of each of the storage cells 10 can be connected to a functional signal input 30. Furthermore, each of the storage devices 11 can be connected to a functional signal output 31 via a respective output circuit 13 which is again symbolically represented by a simple switch. Each of the input circuits 12 can be activated via a control lead 14 and, similarly, each of the output circuits 13 can be activated via a respective control lead 15. Each storage cell 10 thus comprises a storage device 11, an input circuit 12 and an output circuit 13.

The control lead 14 of the input circuit 12 of each storage cell 10 is connected to the control lead 15 of the output circuit 13 of the next storage cell in the row of storage cells. This combination, represented in simplified form as a lead in the embodiment of FIG. 1, constitutes a drive device which realizes common activation of the storage operation in a storage cell and the read-out operation in the subsequent storage cell, for example the storage cells bearing the sequence numbers 1 and 2 respectively.

Each trigger circuit 20 comprises a D-flipflop 21 whose clock input 22 is connected to a clock lead 32 which is common to all trigger circuits 20. The common clock lead 32 receives a common clock signal CL via a clock signal terminal 33.

With the exception of the trigger circuit bearing the sequence number 1, the D-input 23 of the D-flipflop 21 in each bistable trigger circuit is preceded by an AND-gate 24. A first input of the AND-gate 24 is connected to a Q-output 25 of the D-flipflop 21 of the preceding trigger circuit 20 in the chain, whereas a second input of the AND-gate 24 is connected to an enable lead 34 which is common to all trigger circuits 20 and hence to all AND-gates 24. The enable lead 34 carries an enable signal SHE which is output by a command device 35. Thus, in each AND-gate 24 an output signal of the preceding trigger circuit 20 is combined with the enable signal SHE from the command device 35. For example, in the AND-gate 24 of the bistable trigger circuit 20 bearing the sequence number 2 the output signal Q1 of the bistable trigger circuit 20 having the sequence number 1 is combined with the enable signal SHE. The output signals of the trigger circuits 20 are provided with references which are formed by the capital letter Q in conjunction with the sequence number of the associated trigger circuit 20.

The trigger circuit 20 bearing the sequence number 1 does not comprise an AND-gate 24 in the present embodiment. Instead, the D-input 23 of the flipflop 21 of the trigger circuit 20 bearing the sequence number 1 receives the inverse of the enable signal SHE from the command device 35 directly via a lead 36.

During operation of the circuit arrangement shown in FIG. 1, signal samples are taken by sampling a functional signal to be delayed which is applied via the functional signal input 30. The respective signal samples taken are stored in the storage device 11 of one of the storage cells. After a presettable delay time has elapsed, the signal samples stored in the storage devices 11 are read out again and applied to the functional signal output 31 as a delayed functional signal. The signal samples are taken from the functional signal applied to the functional signal input 30 at time intervals which are predetermined by the clock signal CL. For correct reproduction of the delayed functional signal, the storage of new signal samples and the delayed reading out of stored signal samples take place simultaneously. A continuous stream of signal samples is thus obtained at the useful signal output 31.

Such coincidence is achieved in the circuit arrangement of FIG. 1 in that the control lead 15 for the output circuit 13 of a storage cell 10 having a given sequence number (for example, 3) and the control lead 14 for the input circuit 12 are connected to the storage cell 10 which has been read out a period of time before that, which period is determined by the clock signal, i.e. the storage cell having a sequence number which is 1 lower. Each of these connections is connected to the Q-output 25 of the bistable trigger circuit 20 having the same sequence number as the storage cell 10 whose control lead 14 of the input circuit 12 forms part of the current connection in order to form a common drive device, so that it is controlled by the associated output signal Q having the corresponding sequence number. It is thus ensured that the signal sample stored in a storage device is read and replaced by a new signal sample only after a further time interval which is predetermined by the clock signal CL. For correct execution of this operation, a single pulse is continuously propagated through the shift register device formed by the chain of trigger circuits 20 and clocked by the clock signal CL. Preferably, said predetermined time interval corresponds to a period duration of the clock signal CL. The clock signal CL determines the sequence frequency of the signal samples and, in conjunction with the number of storage cells 10 used, the overall delay time of the circuit arrangement is obtained. This delay time results from the multiples of the time intervals, determined by the number of storage cells 10 used minus 1 and in which the signal samples are stored, i.e. the corresponding multiple of the period duration of the clock signal CL in the present example.

The operation of the circuit arrangement of FIG. 1 will be described in detail hereinafter with reference to the diagrams of FIG. 3. In synchronism with the positive-going signal edges of the clock signal CL, the enable signal SHE of FIG. 3 exhibits a negative-going pulse edge associated with a pulse of the length of one period duration of the clock signal CL. Similarly, the inverse of the enable signal SHE exhibits a positive pulse at this location. Therefore, a positive pulse is applied to the trigger circuit 20 having the sequence number 1, via the lead 36, and hence to the D-input 23 of the D-flipflop 21 included therein. This pulse commences at the instant t2 and still exists at the instant t3, being the instant of the next, positive-going edge of the clock signal CL. Due to the positive-going edge in the clock signal CL occurring at the instant t3, the positive signal level of the inverse of the enable signal SHE is loaded, via the D-input 23 of the D-flipflop 21 of the trigger circuit 20 having the sequence number 1, into this D-flipflop 21 and appears at the Q-output 25. The output signal Q1 derived therefrom thus exhibits a transition from the low to the high signal level at the instant t3. Moreover, the clock signal CL terminates the pulse in the enable signal SHE and the inverse thereof.

The enable signal SHE, applied by the command device 35, via the enable lead 34, to all bistable trigger circuits 20 except for the circuit bearing the sequence number 1, in which circuits it is applied to one of the inputs of the AND-gates 24, serves to enable, in each of the trigger circuits 20 (bearing the sequence number 2 to n) the AND-gates 24 so as to propagate the output signals Q1 to Qn−1 of the respective preceding trigger circuit 20 to the D-input 23 of the associated D-flipflop 21. Thus, because after the instant t3 the enable signal SHE becomes high, the high output signal Q1 is present at the D-input 23 of the D-flipflop 21 of the trigger circuit 20 having the sequence number 2, whereas the D-input 23 of the D-flipflop 21 of the trigger circuit 20 having the sequence number 1 again carries the low level of the inverse of the enable signal SHE. In response to the next positive-going edge in the clock signal CL at instant t4, a low signal level is thus taken over in the D-flipflop 21 of the trigger circuit 20 having the sequence number 1, whereas in the D-flipflop 21 of the trigger circuit 20 having the sequence number 2 the high signal level assumed thus far by the output signal Q1 is taken over. The same occurs in response to the subsequent positive-going edges of the clock signal CL at the instants t5 to t11 (in the example shown in FIG. 3). As a result, a pulse having the duration of a period of the clock signal CL is shifted through the chain of trigger circuits 20, i.e. through the shift register device formed thereby. This continues as long as the enable signal SHE retains its high signal level and the AND-gates 24 thus remain transmissive.

At instant t11 (chosen by way of example in FIG. 3), the enable signal SHE is switched back to a low level, so that the AND-gates 24 are blocked. Upon the next positive-going edge of the clock signal CL at instant t12, the output signal Q9 is no longer propagated to the associated D-flipflop 21 because of the blocked AND-gate 24 in the bistable trigger circuit 20 having the sequence number 10, the latter instead outputs a signal Q10 with a low signal level. The behavior of all other output signals up to the output signal Qn of the trigger circuit 20 of the chain having the sequence number n is the same. The sequence number of the trigger circuit 20 whereto the pulse is shifted through the shift register device can be selected by selection of the time interval between two successive pulses in the enable signal SHE, i.e. by the duration of the continuously high signal level in the enable signal SHE, in steps with the interval of one period duration of the clock signal CL.

Simultaneously with the (negative) pulse in the enable signal SHE at the instant t11, via the inverse of the enable signal SHE a new pulse is applied to the trigger circuit 20 having the sequence number 1, which new pulse, in conformity with the operations at the instant t3, is stored, in response to the next positive-going edge in the clock signal CL at the instant t12, by the D-flipflop 21 of the bistable trigger circuit 20 having the sequence number 1 and hence appears in the output signal Q1. This new pulse is subsequently shifted through the shift register device until the next pulse in the enable signal SHE or its inverse occurs.

The output signals Q1 to Qn−1 control the respective connections of the control leads 14 and 15 for the input circuit 12 of the storage cell 10 having the same sequence number as that of the output signal Q1 to Qn−1 and control the output circuit 13 of the storage cell 10 of the next-higher sequence number in such a manner that the relevant input circuit 12 and output circuit 13 are activated. In the diagram of FIG. 1 this means that the switches shown therein are closed so that a signal sample from the useful signal input 30 can be stored in the storage device 11 of the storage cell having the relevant sequence number and that at the same time the signal sample stored in the storage device 11 of the storage cell 10 having the next higher sequence number is read out via output 31. In FIG. 3 in the storage in the associated storage device 11 takes place during the time of high signal level of the output signal Q having the same sequence number, whereas the time interval during which a stored signal sample is read out is shown as a hatched field in the waveform of the output signal Q whose sequence number corresponds to that of the storage cell 10 read out. For example, simultaneously with the occurrence of a pulse of high signal level in the output signal Q1 between the instants t3 and t4 a signal sample from the useful signal input 30 is stored in the storage device 11 of the storage cell 10 having the sequence number 1 and at the same time the signal sample stored in the storage device 11 of the storage cell 10 having the sequence number 2 is read out at the useful signal output 31. A hatched field is, therefore, included in the waveform of the output signal Q2 between the instants t3 and t4. The curves of FIG. 3 reveal that a signal sample stored in one of the storage devices 11 is read out directly before the storage of a new signal sample. For example, between the instants t2 and t3 a signal sample stored in the storage cell 10 with sequence number 1 is read out and subsequently a new signal sample is stored between the instants t3 and t4. This sample remains stored in the storage cell 10 having the sequence number 1 until the instant t11, after which it is read out at instant t12, after which immediately a new signal sample is stored. The stored signal sample is thus delayed from the instant t3 until the instant t11, corresponding to a delay time of eight periods of the clock signal CL.

The output circuit 13 of the storage cell 10 having the sequence number 1 and the input circuit 12 of the storage cell 10 having the sequence number n are not activated by the same output signal Q1, but, via the lead 36, by the inverse of the enable signal SHE or the output signal Qn. However, because the output signal Q of the last trigger circuit 20 traversed by the pulse propagated in the shift register device occurs simultaneously with the new pulse in the inverse of the enable signal SHE (and hence in the enable signal SHE), the input circuit 12 of the last storage cell 10 used for the selected delay time is always activated simultaneously with the output circuit 13 of the storage cell 10 having the sequence number 1.

Figure 2:
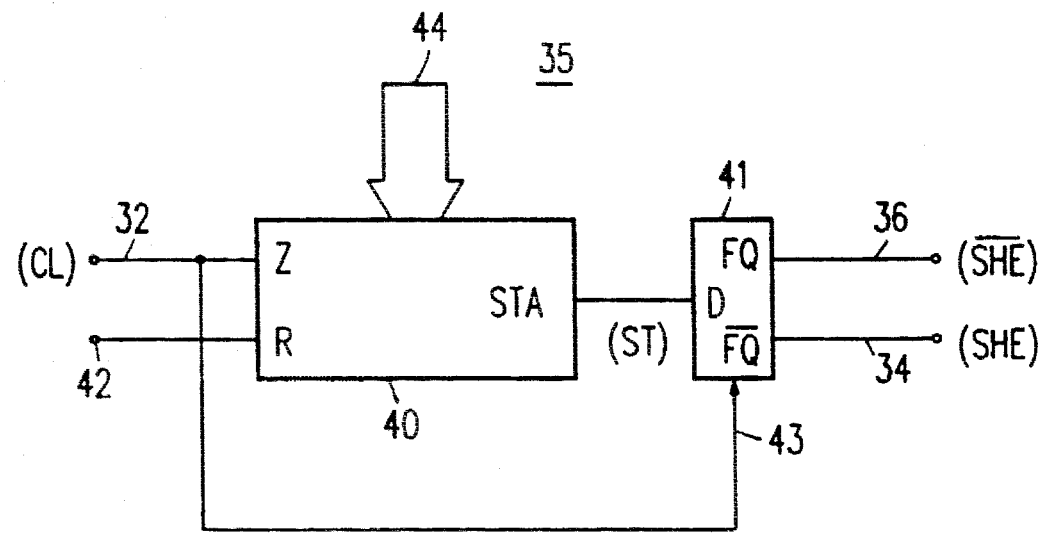
FIG. 2 shows a block diagram of an embodiment of a command device for use in a circuit arrangement as shown in FIG. 1.

FIG. 2 shows a block diagram of an embodiment of the command device generating the enable signal SHE as well as its inverse. This embodiment of the command device 35 comprises a presettable counting device 40 whose counting cycle can be adjusted to the selected multiple of the periods of the clock signal CL. A counting input Z of the counting device receives the clock signal CL via the clock lead 32. After each counting cycle, a start signal output STA of the counting device 40 outputs a start pulse ST which has a duration amounting to one period of the clock signal CL and which is also plotted as a function of time t in FIG. 3. The start pulse ST is applied to the D-input of D-flipflop 41. The signal level of the start pulse ST present at the D-input of the D-flipflop 41 is loaded into the D-flipflop 41 in response to the next positive-going edge of the clock signal CL, i.e. at the instant t2 in FIG. 3 (whereas the first start pulse commences at the instant t1), so that as from the instant t2 it is present at a non-inverting output FQ of the D-flipflop 41, connected to the lead 36, as the inverse of the enable signal SHE, whereas it is output in inverted form at an inverting output of the D-flipflop 41 which is denoted by the reference including the inversion sign FQ in FIG. 2. This inverting output of the D-flipflop 41 is connected to the enable lead 34; the signal at the inverting output of the D-flipflop 41 thus forms the enable signal SHE. Via a synchronization input 42, being connected to a reset input R of the counting device 40 within the command device 35, the counting operation in the counting device 40 can be synchronized, if necessary, and the counting device 40 can also be set to a defined state, for example when it is put into operation. For correct operation of the command device 35, the D-flipflop 41 included therein is controlled by the clock signal CL via a clock input 43.

The counting device 40 can be preset to a desired counting cycle via a data input 44. It then counts from a first reference value, for example zero, to a second reference value which is supplied via the data input 44, and is reset to the first reference value while supplying the start pulse ST, after which it again counts to the second reference value under the control of the clock signal CL. Thus, via the data input 44 the desired delay time can be simply preset by way of digital control signals; and can also be quickly and simply changed during operation of the circuit arrangement.

Figure 3:
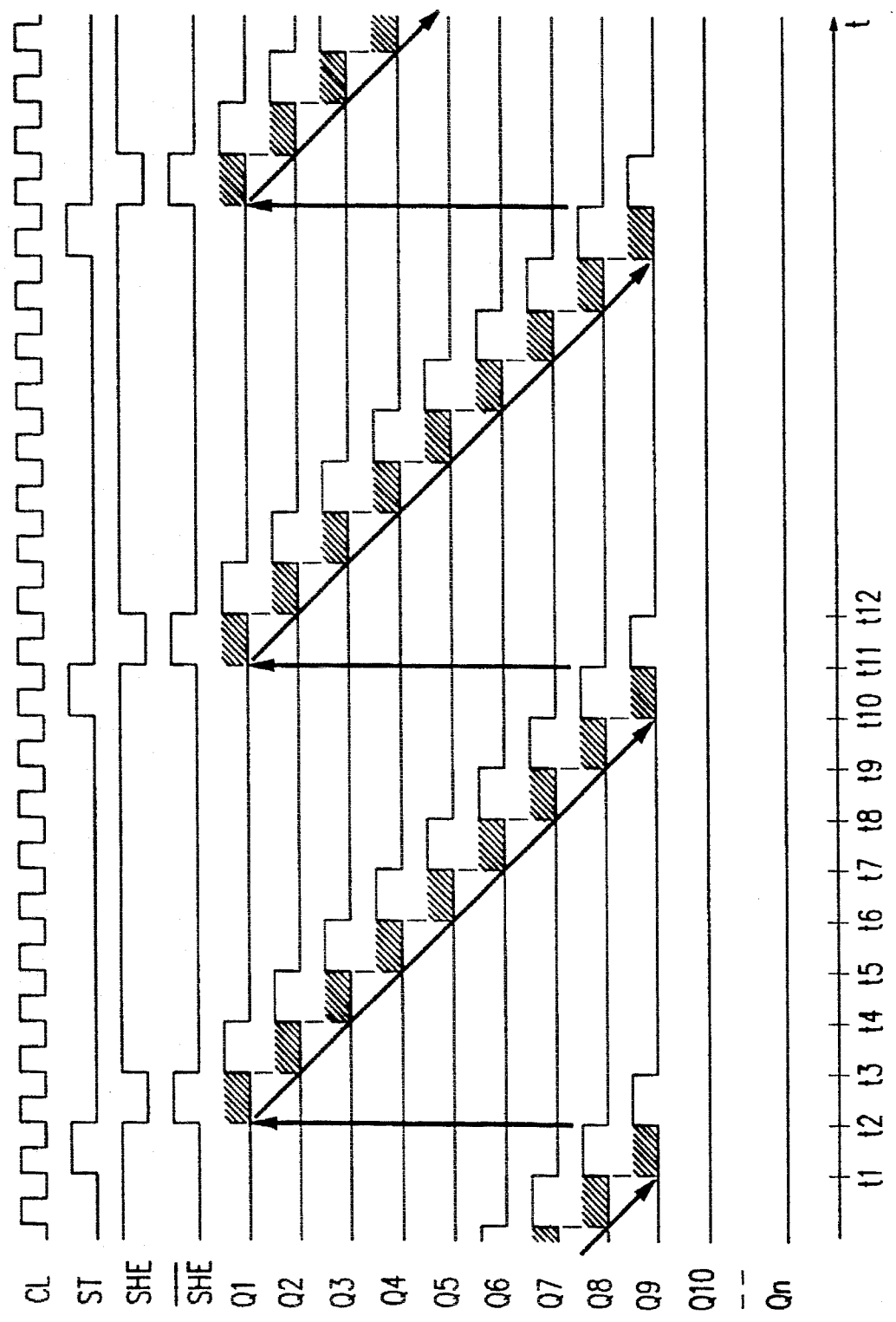
FIG. 3 shows some simplified signal waveforms in the circuit arrangement shown in FIGS. 1 and 2.

The embodiment of the invention shown in the FIGS. 1 to 3 is a preferred embodiment in which the enable signal applied to the first trigger circuit 20 of the shift register device corresponds to the start pulse ST shifted by one period of the clock signal CL and hence to the inverse of the enable signal SHE applied to the other trigger circuits 20.

Figure 4:
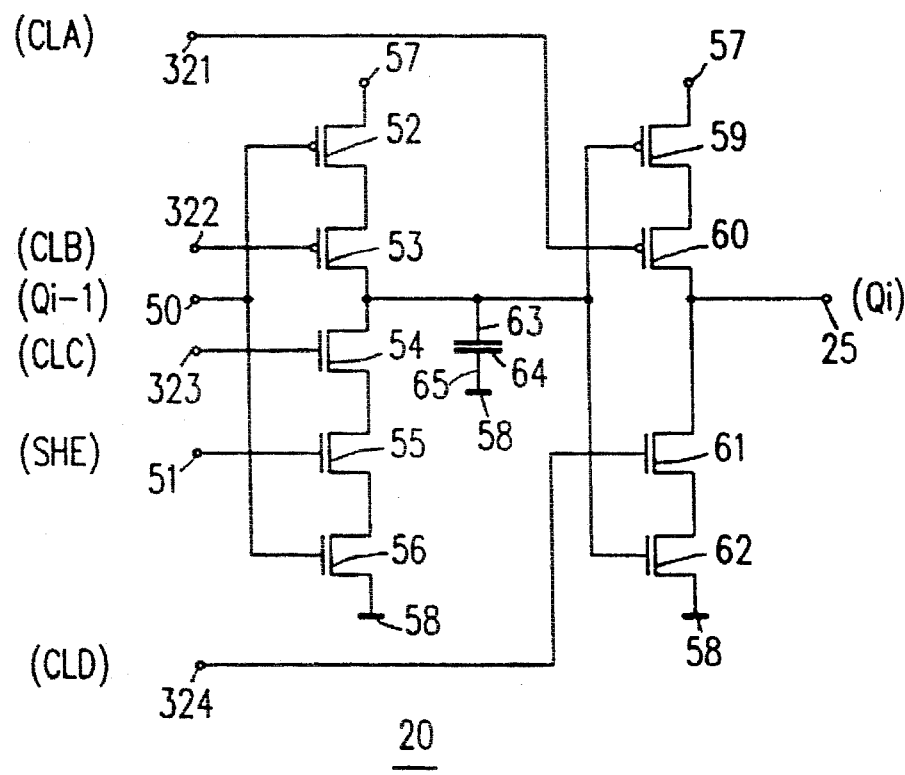
FIG. 4 shows an embodiment of a trigger circuit for use in the circuit arrangement of FIG. 1.

FIG. 4 shows a transistor diagram of an embodiment of a bistable trigger circuit 20 having one of the sequence numbers from 2 to n, i.e. for a trigger circuit 20 comprising an AND-gate 24. The trigger circuit 20 having the sequence number 1 can be simply deduced from this diagram by connecting the inputs of the AND-gate 24. In the diagram of FIG. 4 these inputs correspond to a connection 50 for the output signal Qi−1 of the preceding trigger circuit 20 in the chain, i.e. the trigger circuit whose sequence number has been lowered by 1, or to a connection 51 which is connected to the enable lead 34 in order to supply the enable signal SHE. The output signal Qi is output by the Q-output 25.

The embodiment of the bistable trigger circuit 20 shown in FIG. 4 comprises a first series connection of five field effect transistors 52 to 56 whose main current paths are connected in series between a supply voltage terminal 57 and ground 58, as well as a second series connection of four field effect transistors 59, 60, 61, 62 whose main current paths are connected in series between the supply voltage terminal and ground. The field effect transistors 52, 53, 59 and 60 are of the opposite conductivity type relative to the field effect transistors 54, 55, 56, 61 and 62, so that a high signal level at the gate terminal of the field effect transistors 52, 53, 59, 60 blocks the main current paths of these transistors whereas a high signal level at the gate terminals of the other field effect transistors 54, 55, 56, 61, 62 switches their main current paths to the conductive state.

The gate terminals of the first field effect transistor 52 and the fifth field effect transistor 56 of the first series connection are connected to one another and to the terminal 50 for receiving the output signal Qi−1 of the preceding trigger circuit, whereas the gate terminal of the fourth field effect transistor 55 is connected to the terminal 51 for the enable signal SHE. From the junction of the main current paths of the second field effect transistor 53 and the third field effect transistor 54 a connection extends to the gate terminals of the sixth field effect transistor 59 and the ninth field effect transistor 62 of the second series connection and, moreover, to a terminal 63 of a capacitor 64 whose other terminal 65 is connected to ground 58. The Q-output 25 is connected to the junction of the main current paths of the seventh field effect transistor 60 and the eighth field effect transistor 61.

The gate terminal of the seventh field effect transistor 60 is connected to a first clock signal input 321 for a first clock signal CLA, whereas the gate terminal of the second field effect transistor 53 is connected to a second clock signal input 322 for a second clock signal CLB, the gate terminal of the third field effect transistor 54 is connected to a third clock signal input 323 for a third clock signal CLC, and the gate terminal of the eighth field effect transistor 61 is connected to a fourth clock signal input 324 for a fourth clock signal CLD. The second clock signal CLB and the third clock signal CLC at the second clock signal input 322 and the third clock signal 323, respectively, enable the first series connection with the field effect transistors 52 to 56 to be switched to the conductive state and the blocked state via the second field effect transistor 53 and the third field effect transistor 54, respectively, whereas the first clock signal CLA and the fourth clock signal CLD can switch the second series connection of the field effect transistors 59 to 62 to the conductive and the blocked state, as desired via the seventh field effect transistor 60 and the eighth field effect transistor 61, respectively. In the blocked state of both series connections, the first clock signal CLA and the second clock signal CLB have a high signal level, whereas the third clock signal CLC and the fourth clock signal CLD have a low signal level. The second field transistor 53, the third field effect transistor 54, the seventh field effect transistor 60 and the eighth field effect transistor 61 are then blocked to the same degree, and the capacitor 64 as well as the Q-output 25 are isolated from the charge supply and drain to and from the supply voltage terminal 57 and the ground terminal 58, respectively. The charge condition, i.e. the (binary) information stored in the capacitor 64, is thus maintained in unchanged form.

For the storage of new information, as is to be performed, for example, when the start pulse is shifted through the shift register device of FIG. 1 in the individual trigger circuits 20, during a first step the level of the second clock signal CLB is switched to a low value and the level of the third clock signal CLC is switched to a high value. The second field effect transistor 53 and the third field effect transistor 54 are thus rendered conductive. In dependence on the signal levels on the terminals 50 and 51 for the output signal Qi−1 and the enable signal SHE, respectively, the capacitor 64 is then charged either to the signal level of the supply voltage terminal 57 or to the signal level of ground 58. Discharging takes place when a high signal level is applied simultaneously to the terminals 50, 51, whereas charging of the capacitor 64 takes place in the presence of a low signal level at the terminal 50. A transition of the signal level of the second clock signal CLB and the third clock signal CLC to their original values blocks the first series connection again and sustains the charge across the capacitor 64.

During a second step, transition of the first clock signal CLA to a low signal level and of the fourth clock signal CLD to a high signal level renders the second series connection conductive. The signal level, i.e. the charge condition of the capacitor 64, is then decisive as to whether, in the presence of a high signal level, the Q-output 25 is connected to ground 58 or, in the presence of a low signal level, to the supply voltage terminal 57 and the corresponding levels are applied to the Q-output 25 as the output signal Qi. The signal level at the capacitor 64 is thus output in inverted form at the Q-output 25.

The four clock signals CLA, CLB, CLC and CLD can be derived from the clock signal CL, for example from the half periods thereof. The positive-going edge of the clock signal CL then corresponds essentially to the transition of the first clock signal CLA from the high to the low signal level as well as to the simultaneous transition of the fourth clock signal CLD from the low to the high signal level.

The described circuit arrangement in accordance with the invention for delaying a useful signal is advantageously used for delay lines in the video frequency range. For these applications different delay times are required because of the different television standards wherebetween in a multistandard receiver switching is required also during operation. Moreover, delay lines having an adaptable delay time can be constructed for use in decoders for video signals transmitted in time multiplex such as, for example the D2MAC standard, for compression and decompression circuits for image format conversion, for echo suppression for television transmission, as well as for multistandard video comb filters. The delay time is then adapted completely without disturbances in the circuit arrangement in accordance with the invention.

I claim:

1. A device for delaying a functional signal by a selectable number of discrete clock pulse periods, said device comprising:

input means for receiving said functional signal;

a series of storage devices each having a storage element switchably coupled to said input means each storage element for storing a sample of said functional signal received from said input means;

output means for outputting a delayed said functional signal, said output means being switchably coupled to said storage elements, and said delayed functional signal being received by said output means parallelly from said storage elements;

a shift register having a series of stages each stage being coupled to a single one of said storage devices;

clock means coupled to the shift register for recurrently providing shift pulses to said shift register; and load means coupled to the shift register for providing at selectable recurrence intervals a control signal to said shift register which control signal is serially shifted through said series of stages and wherein said control signal, when shifted into a particular stage, controls loading of the storage elements, which storage element is within the storage device coupled to the particular stage, with the sample of the functional signal and controls unloading of a delayed sample of the functional signal which was stored in a storage element of a next storage device in said series of storage devices.

2. A device as claimed in claim 1, wherein said shift register includes shift block elements within various stages and wherein said control signal, when being provided, activates said shift block elements for terminating shifting of any earlier control signal loaded in said shift register.

3. A circuit arrangement for delaying a functional signal, comprising:

input means for receiving the functional signal;

a row of storage devices coupled to the input means and including in each storage device a storage element for storing time discrete signal samples of the functional signal at time intervals determined by a clock signal;

output means coupled to the storage devices for receiving said discrete signal samples from said storage devices after expiration of a selectable time delay;

a plurality of activation devices each for activating a storage device to cause the storage element of the activated storage device to store a time discrete signal sample and for activating a next storage device in the row of storage devices to cause the storage element of the next storage device to output its previously stored discrete signal sample, said plurality of activation devices comprising a chain of bistable trigger circuits each bistable trigger circuit having an output connected to an input of a next trigger circuit in the chain, each activation device of said plurality including one of said trigger circuits being switched by the clock signal; and a command device coupled to a first trigger circuit for applying a first pulse to the first trigger circuit at a first instant which causes the first pulse to propagate through the chain of trigger circuits in conformity with the clock signal and which interrupts the propagation of the first pulse at a second instant and at the same time applies a next start pulse to the first trigger circuit which causes the next start pulse to propagate through the chain of trigger circuits, the time interval between the first instant and the second instant amounting to a selectable integer multiple of periods of the clock signal, the number of storage devices corresponding at least to said multiple of the periods of the clock signal.

4. A circuit arrangement as claimed in claim 3, characterized in that the command device comprises a presettable counting device whose counting cycle is adjustable to the selected multiple of the periods of the clock signal and which outputs one of the pulses after each counting cycle.

5. A circuit arrangement as claimed in claim 4, characterized in that the trigger circuits each comprise a respective D-flipflop clocked in common by the clock signal.

6. A circuit arrangement as claimed in claim 3, characterized in that the trigger circuits each comprise a respective D-flipflop clocked in common by the clock signal.

7. A circuit arrangement as claimed in claim 6, characterized in that the input of each D-flipflop is preceded by an AND-gate having a first input which receives the output signal of the preceding trigger circuit and a second input which receives an enable signal from the command device.

8. A circuit arrangement as claimed in claim 7, characterized in that the first trigger circuit of the shift register device receives the inverse of the enable signal applied to the other trigger circuits.

9. A circuit arrangement as claimed in claim 8, characterized in that the enable signal applied to the first trigger circuit of the shift register device corresponds to the start pulse shifted by one period of the clock signal.

* * * * *